US007863988B2

(12) United States Patent
Baek et al.

(10) Patent No.: US 7,863,988 B2
(45) Date of Patent: Jan. 4, 2011

(54) MICROWAVE SIGNAL GENERATOR

(75) Inventors: Seung Won Baek, Seoul (KR); Chae Hyun Baek, Seoul (KR); Yong Soo Lee, Seoul (KR); Jin Joo Choi, Seoul (KR)

(73) Assignee: LG Electronics Inc., Seoul (KR)

( * ) Notice: Subject to any disclaimer, the term of this patent is extended or adjusted under 35 U.S.C. 154(b) by 214 days.

(21) Appl. No.: 12/222,455

(22) Filed: Aug. 8, 2008

(65) Prior Publication Data

US 2009/0091395 A1 Apr. 9, 2009

(30) Foreign Application Priority Data

Sep. 19, 2007 (KR) ...................... 10-2007-0095379

(51) Int. Cl.
*H03L 7/00* (2006.01)

(52) U.S. Cl. ...................... 331/5; 315/344; 315/111.51; 315/248; 315/39; 324/301; 324/304

(58) Field of Classification Search ..................... 331/5, 331/3, 94.1; 315/39.51, 5.41, 248, 111.51, 315/39, 344; 324/304, 301
See application file for complete search history.

(56) References Cited

U.S. PATENT DOCUMENTS

| | | | | |
|---|---|---|---|---|
| 3,820,035 | A * | 6/1974 | Meddaugh | 315/5.13 |
| 4,571,552 | A | 2/1986 | Brown | |
| 4,961,058 | A | 10/1990 | Sigmon | |
| 6,611,104 | B1 | 8/2003 | Kim et al. | |
| 6,734,630 | B1 * | 5/2004 | Choi et al. | 313/638 |
| 6,774,581 | B2 | 8/2004 | Choi et al. | |

* cited by examiner

*Primary Examiner*—Arnold Kinkead
(74) *Attorney, Agent, or Firm*—McKenna Long & Aldridge LLP

(57) ABSTRACT

A microwave signal generator includes a magnetron to generate a microwave signal, a coupler to receive the microwave signal generated by the magnetron and to send the microwave signal to a load; and a band-pass filter to receive the microwave signal from the coupler and to filter the microwave signal to obtain a signal from an oscillation frequency band of the magnetron. The band-pass filter feeds the signal from the oscillation frequency band back to the magnetron in order to fix an oscillation frequency of the magnetron and is a DR (Dielectric Resonator) filter.

16 Claims, 4 Drawing Sheets

MICROWAVE SIGNAL GENERATOR

The present application is based on, and claims priority from, Korean Application Number 10-2007-0095379, filed Sep. 19, 2007, the disclosure of which is incorporated by reference herein in its entirety.

BACKGROUND

1. Technical Field

The following description relates generally to a microwave signal generator. More particularly, the following description relates to a microwave signal generator capable of filtering for a microwave signal corresponding to an intrinsic oscillation frequency of a magnetron from microwave signals generated by the magnetron and using the microwave signal to control the oscillation frequency of the magnetron.

2. Background

Typically, a microwave signal generator uses a traveling wave tube (TWT) or a magnetron to generate a microwave signal. The TWT is very expensive, and thus most microwave signal generators use an inexpensive magnetron to generate a microwave signal.

In one conventional magnetron, a pure copper electrode is arranged as an anode, and a cathode and a grid are axially arranged. With a magnetic field applied in a direction axial of the cathode, electrons radially sputter from the cathode and move toward the anode, which simultaneously receive a force from the magnetic field in a direction perpendicular to a progressing direction of the electrons. As a result, the electrons may perform a spiral movement.

If strength of the magnetic field is increased, the path of the electrons is bent even more causing the electrons to repeatedly rotate before reaching the anode. If the strength of the magnetic field reaches a critical field value (threshold flux density), the chances are that electrons will continuously rotate and not reach the anode at all.

At this time, a rotating electron cloud is generated about the cathode, and an induction current is generated at a vibration circuit of the anode to allow resonance to continue. The oscillation frequency of the magnetron is primarily determined by the vibration circuit. In this manner, the magnetron is capable of producing highly efficient and highly powered electromagnetic energy.

A microwave signal generator for generating a microwave signal using the magnetron is commonly employed in a microwave oven. Such a microwave signal generator could be also used in a PLS (Plasma Lighting System).

The PLS may be configured such that a microwave signal generated by a microwave signal generator is transmitted to a cylindrical oscillator via a waveguide. The oscillator is disposed with an electrode-less bulb having light emitting material hermetically sealed therein. The microwave signal transmitted to the oscillator excites the light emitting material into plasma, which emits visible light or ultraviolet ray.

The PLS typically has a long life and superior illumination over an incandescent light or a fluorescent light widely used for lighting systems, such that the PLS may serve as a light source in a variety of applications such as street lightings. Furthermore, the PLS may be used in large spaced area as opposed to relatively cramped and closed spaced area.

An oscillation frequency of the magnetron may vary unpredictably in response to a load change and an output change of the magnetron itself. The microwave signal generator for generating microwave signals using the magnetron may also generate side bands and harmonics in addition to the main microwave signals of intrinsic high frequency band.

For reasons as described above, the oscillation frequency of the magnetron may not be fixed to one frequency, but may generate several oscillation frequencies due to its intrinsic characteristics and influence by external loads to thereby cause interference with communication within a region.

For instance, there may be a high likelihood that frequency bands of microwave signals generated by the microwave signal generator create interference with frequency bands used for Wibro communication, HSDPA (High Speed Downlink Packet Access), wireless LAN (Local Area Network. IEEE 802.22 standards), Zigbee (IEEE802.15 standards), Bluetooth (IEEE802.15 standards), RFID (Radio Frequency Identification) and satellite telephones.

SUMMARY

Therefore, a microwave signal generator for use in a magnetron should be disposed with a configuration for fixing an oscillation frequency of the magnetron. One example of fixing the oscillation frequency is to generate an injection signal at a frequency close to an intrinsic oscillation frequency of the magnetron, where the generated injection signal is introduced into the magnetron to cause the oscillation frequency of the magnetron to be fixed at the frequency of the injection signal.

Another example of fixing the oscillation frequency of a magnetron is to generate a reference signal at a frequency close to an intrinsic oscillation frequency of the magnetron, where a phase difference between the generated reference signal and a microwave signal actually outputted by the magnetron is compared. A current inputted to the magnetron is controlled using the detected phase difference resulting in the oscillation frequency of the magnetron to be fixed.

However, the microwave signal generator thus described suffers from a drawback in that a high priced signal generator must be additionally mounted for generating a reference signal or an injection signal at a frequency close to the intrinsic oscillation frequency of the magnetron, resulting in increase of manufacturing cost.

Thus, to solve the above-mentioned drawback it is desirable to provide an inexpensive and simple microwave signal generator capable of feed-backing a microwave signal outputted from a magnetron to the magnetron in order to fix an oscillation frequency of the magnetron.

In accordance with the object of the present disclosure, the microwave signal generator is disposed with a band-pass filter for filtering a microwave signal generated by the magnetron to obtain a feedback signal, which is fed-back to the magnetron to cause the oscillation frequency of the magnetron to be self-locking.

In one general aspect, a microwave signal generator comprises: a magnetron for generating a microwave signal; a coupler to receive the microwave signal generated by the magnetron and to send the microwave signal to a load; and a band-pass filter to receive the microwave signal from the coupler and to filter the microwave signal to obtain a signal from an oscillation frequency band of the magnetron, wherein the band-pass filter feeds the signal from the oscillation frequency band back to the magnetron in order to fix an oscillation frequency of the magnetron.

In another general aspect, a microwave signal generator comprises: a magnetron integrally coupled to a load, wherein the magnetron generates a microwave signal; a coupler disposed within the load, wherein the coupler receives the microwave signal generated by the magnetron and sends the microwave signal to the load; and a band-pass filter for passing only the microwave signal of an intrinsic oscillation frequency band of the magnetron from the microwave signal received by the coupler and the signal of the intrinsic oscillation frequency band is fed back to the magnetron.

Implementations of this aspect may include one or more of the following features.

The band-pass filter may be a DR (Dielectric Resonator) filter.

The magnetron, the coupler and the band-pass filter may be connected by a coaxial cable or a waveguide.

The coupler may a coupler using any one coupling method out of center loop coupling, halo loop coupling, segment fed coupling, strap fed coupling and waveguide coupling method.

The microwave signal generator is capable of feed-backing a microwave signal generated by a magnetron to the magnetron to cause an oscillation frequency of the magnetron to be self-locking. As a result, the microwave signal generator may need no expensive signal generator to generate reference signals, and thereby it is simple to construct and manufacturing cost is reduced.

DESCRIPTION OF DRAWINGS

The foregoing and other objects, features, aspects and advantages of the present inventive concept will become more apparent from the following detailed description when taken in conjunction with the accompanying drawings, but it should be construed that the concept is in no way limited to those implementations. It should be noted that wherever possible, the same reference numerals will be used throughout the drawings to refer to the same or like parts, and description thereof is omitted.

DETAILED DESCRIPTION

It should be noted that the following descriptions are provided to assist in a comprehensive understanding of the general inventive concept and should not be construed as limiting the scope of the inventive concept. Thus, it should be apparent that the present general inventive concept and principle are provided to describe in the most useful and easiest way. No more detailed structures that are beyond necessity for understanding the basic principle are provided, and various changes and modifications of the instant novel concept will be recognized by those of ordinary skill in the art.

Figure 1:
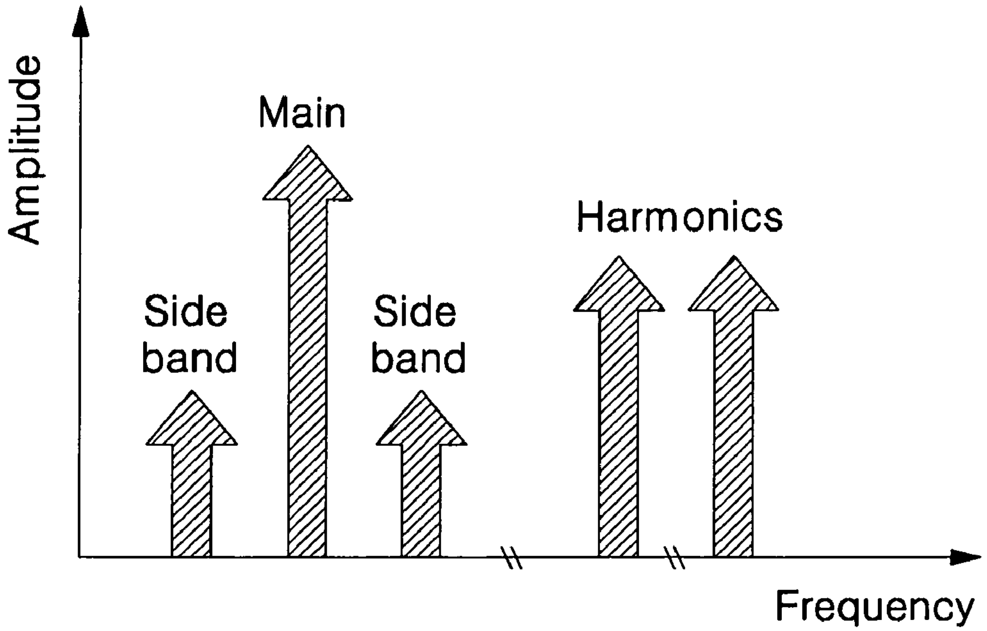
FIG. 1 is a graph illustrating microwave signals generated by an exemplary microwave signal generator.

FIG. 1 is a graph illustrating microwave signals generated by an exemplary microwave signal generator, wherein a microwave signal generated by the magnetron includes side bands and harmonics in addition to a main signal corresponding to an intrinsic oscillation frequency band of the magnetron.

If the microwave signal generator is used in a plasma lighting system that covers a wide area, there is a high likelihood that the side bands and the harmonics generated by the magnetron may cause interference with signals in frequency bands used by peripheral communication devices.

Therefore, it may be necessary that the oscillation frequency of the magnetron that generates microwave signals is fixed to limit the generation of side bands and harmonics, so that the microwave signals generated by the magnetron do not interfere with signals of frequency bands used by other peripheral communication devices.

Figure 2:
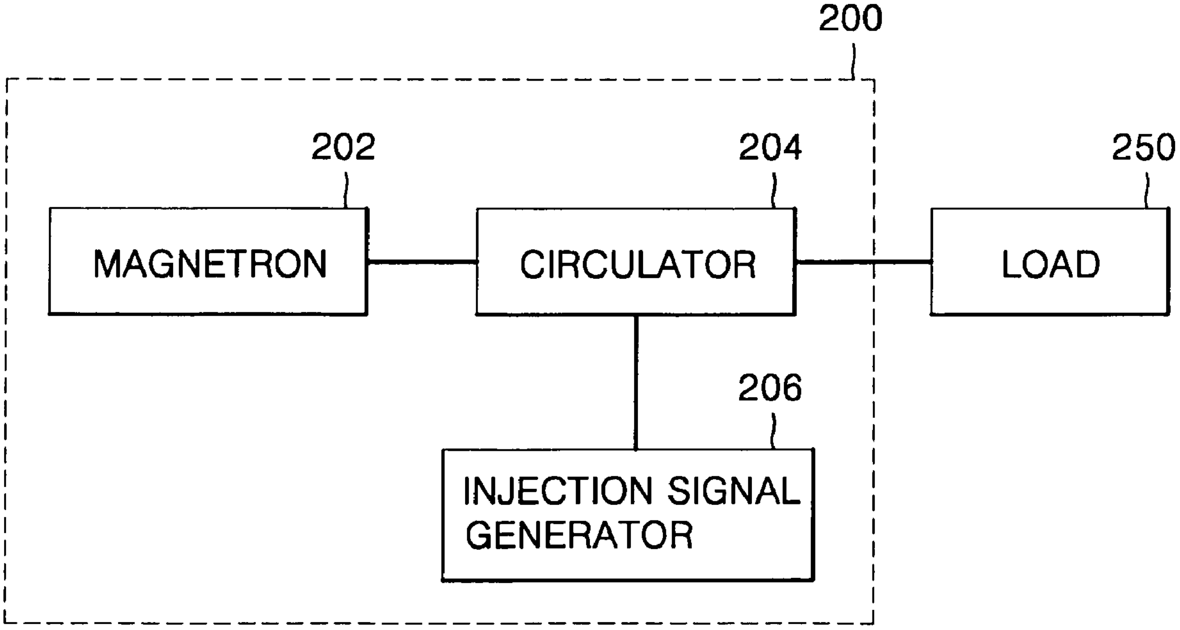
FIG. 2 is a block diagram illustrating an exemplary microwave signal generator according to an example.

FIG. 2 is a block diagram illustrating an exemplary microwave signal generator (200) according to an example, where the microwave signal generator (200) includes a magnetron (202), a circulator (204) and an injection signal generator (206).

The injection signal generator (206) serves to generate an injection signal having a frequency close to the intrinsic oscillation frequency of the magnetron (202). The circulator (204) may inject the injection signal generated by the injection signal generator (206) into the magnetron (202). The magnetron (202) may be oscillated by being synchronized with the injection signal and generate a microwave signal of oscillation frequency synchronized thereto. Therefore, the oscillation frequency of the magnetron (202) may not drift and be fixed as magnetron (202) generates the microwave signal which is synchronized with the injection signal. The microwave signal generated by the magnetron (202) may be received by the circulator (204) and transmitted to a load (250).

It should be noted that the above exemplary microwave signal generator basically generates an injection signal having a frequency close to the intrinsic oscillation frequency of the magnetron (202). To do this, an expensive injection signal generator (206) is additionally mounted to generate the injection signal.

Figure 3:
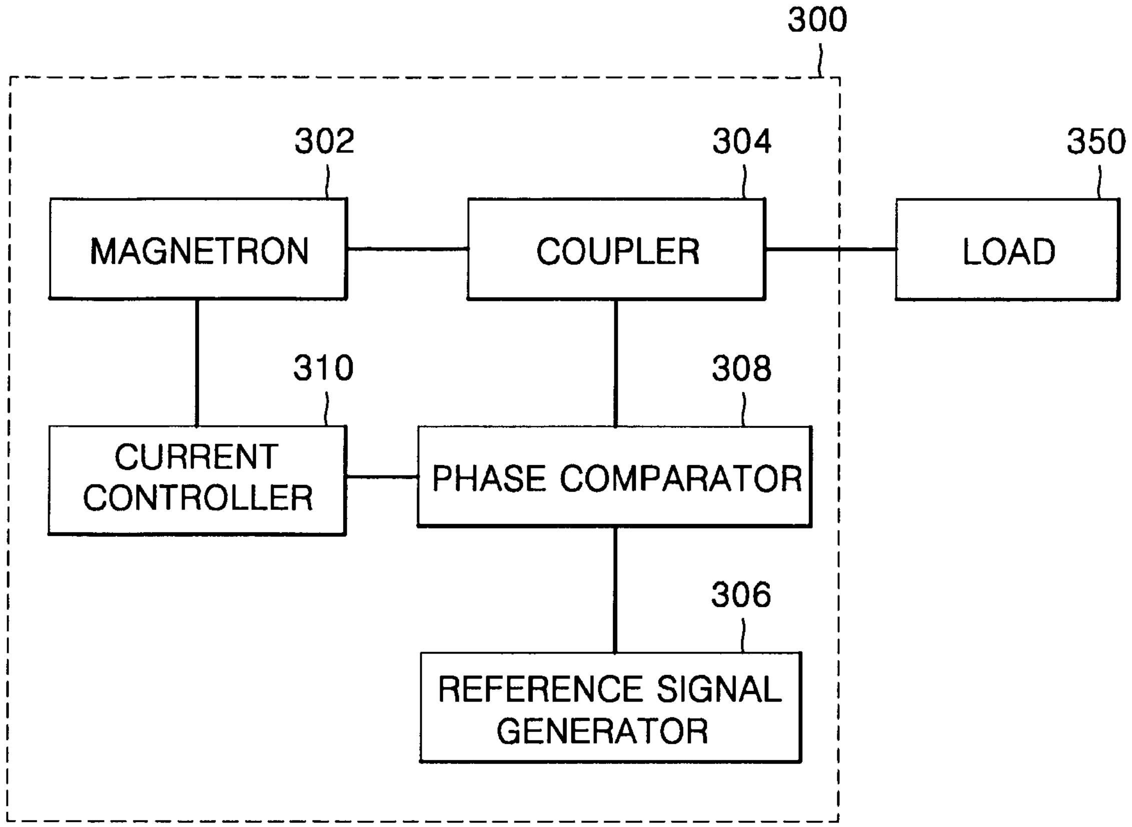
FIG. 3 is a block diagram illustrating an exemplary microwave signal generator according to another example.

FIG. 3 is a block diagram illustrating an exemplary microwave signal generator (300) according to another example, where the microwave signal generator (300) may include a magnetron (302), a coupler (304), a reference signal generator (306), a phase comparator (308) and a current controller (310).

The coupler (304) may receive a microwave signal oscillated and outputted by the magnetron (302) and output the microwave signal to a load (350). The reference signal generator (306) may generate a reference signal having a frequency close to the intrinsic oscillation frequency of the magnetron (302).

The reference signal generated by the reference signal generator (306) and the microwave signal transmitted to the load (350) by the coupler (304) may be respectively inputted into the phase comparator (308). The phase comparator (308) in turn may compare the phase of the reference signal with that of the microwave signal to detect a phase difference. The detected phase difference may be inputted into the current controller (310). The current controller (310) may adjust the amount of current supplied to the magnetron (302) responsive to the received phase difference to induce the oscillation frequency of the magnetron (302) to be fixed.

However, it should be noted that the above exemplary microwave signal generator may likewise be mounted with an expensive reference signal generator (306) for generating a reference signal having a frequency close to the intrinsic oscillation frequency of the magnetron (302). Besides, the exemplary microwave signal generator may further be equipped with an expensive phase comparator (308) and a current controller (310).

Therefore, the microwave signal generator according to an embodiment of the present inventive concept has an advantage in that additional injection signal generator or reference signal generator may be dispensed with, and yet fix an oscillation frequency of the magnetron.

To this end, the microwave signal generator may have a self-locking construction for the oscillation frequency of the magnetron to be fixed by feed-backing the microwave signal outputted by the magnetron to the magnetron.

Figure 4:
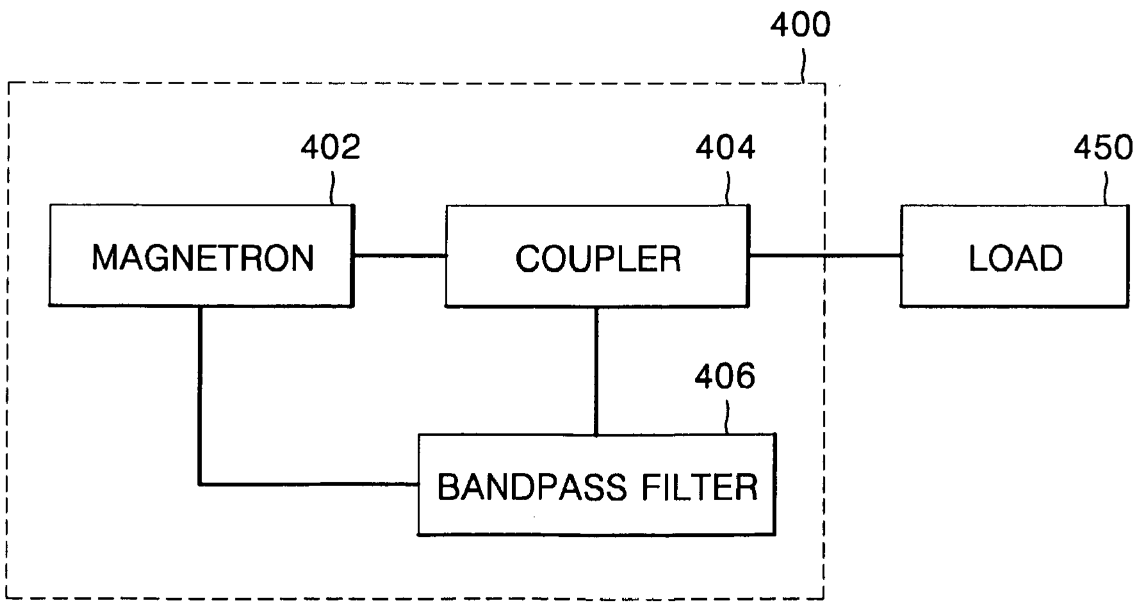
FIG. 4 is a block diagram illustrating an exemplary microwave signal generator according to one embodiment.

Referring to FIG. 4 which is a block diagram illustrating a microwave signal generator (400) according to one embodiment, where the microwave signal generator (400) may include a magnetron (402), a coupler (404) and a band-pass filter (406).

The coupler (404) may receive a microwave signal oscillated and outputted by the magnetron (402) and output the received microwave signal to a load (450). The coupler (404) may be a coupler using any one coupling method out of center loop coupling method, halo loop coupling method, segment fed coupling method, strap fed coupling method, waveguide coupling method, and other methods.

The band-pass filter (406) may filter the microwave signal received by the coupler (404) and pass only a magnetron signal corresponding to the intrinsic oscillation frequency band of the magnetron. For efficiency purposes, for example, a DR (Dielectric Resonator) filter having a smaller power loss of the microwave signal, for instance, be used as the band-pass filter (406) to filter the microwave signal.

The microwave signal having passed the band-pass filter (406) may be inputted into the magnetron (402). The microwave signal filtered by the band-pass filter (406), i.e., the microwave signal generated by the oscillation of the magnetron (402) may be fed-back to the magnetron (402), whereby the oscillation of the magnetron (402) may be synchronized by the fed-back microwave signal. The microwave signal outputted by oscillation of the magnetron (402) and the fed-back microwave signal may be combined to cause the magnetron (402) to generate a microwave signal having a fixed frequency.

As noted from the above description, the microwave signal generator (400) may have a construction of the oscillation frequency of the magnetron (402) being self-locking.

Meanwhile, each constituent element of the microwave signal generator, i.e., the magnetron (402), the coupler (404), connection between band-pass filters (406) and connection of coupler (404) of the microwave signal generator (400) may be preferably connected using a coaxial cable or a waveguide in accordance with system characteristics.

Figure 5:
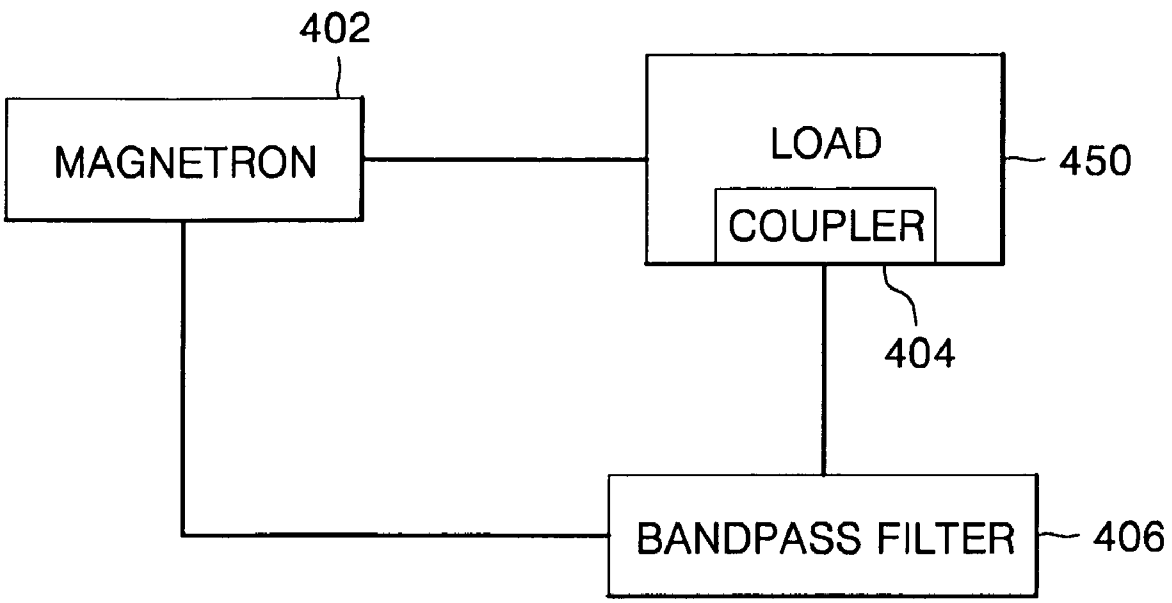
FIG. 5 is a block diagram illustrating an exemplary microwave signal generator according to another embodiment.

FIG. 5 is a block diagram illustrating a microwave signal generator according to another embodiment.

Referring to FIG. 5, the coupler (404) is disposed within the load (450). The microwave signal outputted by the magnetron (402) may be received by the coupler (404) and transmitted to the load (450). The microwave signal received by the coupler (404) may be filtered by the band-pass filter (406) and fed-backed to the magnetron (402). The magnetron (402), the coupler (404) and the band-pass filter (406) may be connected by a coaxial cable or a waveguide to cater to the system characteristics.

Figure 6:
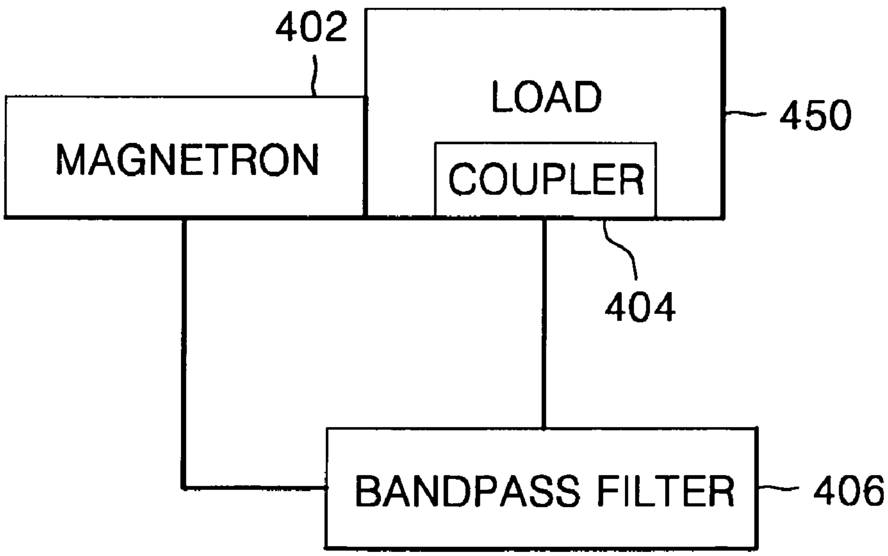
FIG. 6 is a block diagram illustrating an exemplary microwave signal generator according to still another embodiment.

FIG. 6 is a block diagram illustrating a microwave signal generator according to still another embodiment, wherein the microwave signal generator is constructed by integrally combining the magnetron (402), the coupler (404) and the load (450).

The magnetron (402), the coupler (404) and the load (450) may be directly connected, and a connection between the coupler (404) and the band-pass filter (406), and a connection between the band-pass filter (406) and the magnetron (402) may be connected using the coaxial cable or a waveguide to cater to the system characteristics.

The microwave signal generators according to the embodiments as shown in FIGS. 5 and 6 may be a adequately constructed for use in light systems such as plasma lighting system, for example.

Figure 7:
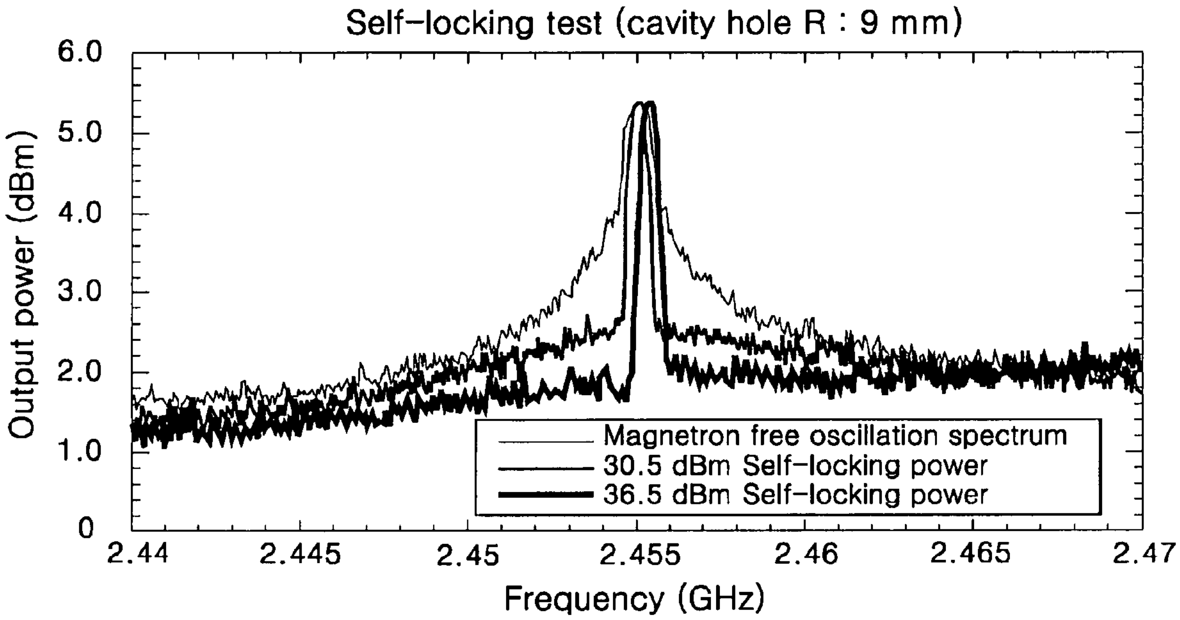
FIG. 7 is a graph illustrating frequency spectrum of a microwave signal generated by an exemplary microwave signal generator according to an embodiment.

FIG. 7 is a graph illustrating frequency spectrum of a microwave signal generated by an exemplary microwave signal generator.

It may be noted that the microwave signal outputted by the magnetron (402) and the microwave signal of the intrinsic oscillation frequency band of the magnetron (402) are fed-backed to the magnetron (402) to cause the oscillation frequency of the magnetron (402) to be fixed and self-locking, such that the frequency of the microwave signal outputted by the magnetron (402) of the microwave signal generator is fixed to a particular frequency band.

Although the above-described implementations may be embodied in several forms without departing from the spirit or essential characteristics thereof, it should also be understood that the implementations are not limited by any of the details of the foregoing description, unless otherwise specified, but rather should be construed broadly within its spirit and scope as defined in the appended claims, and therefore those skilled in the art will appreciate that all changes and modifications that fall within the metes and bounds of the claims, or equivalence of such metes and bounds are therefore intended to be embraced by the appended claims. The described implementations serve only for explanation and are not limiting.

A microwave signal of a particular frequency band out of microwave signals generated by a magnetron in a microwave signal generator is filtered and fed-back to the magnetron for self-locking a microwave signal outputted by the magnetron.

Therefore, side bands and harmonics are restricted from being generated from the magnetron with a simple construction to thereby prevent the frequency interference from occurring among frequency bands used in peripheral communication systems.

What is claimed is:

1. A microwave signal generator comprising:

a magnetron to generate a microwave signal;

a coupler to receive the microwave signal generated by the magnetron and to send the microwave signal to a load; and a band-pass filter to receive the microwave signal from the coupler and to filter the microwave signal to obtain a signal from an oscillation frequency band of the magnetron, wherein the band-pass filter feeds the signal from the oscillation frequency band back to the magnetron in order to fix an oscillation frequency of the magnetron, wherein the band-pass filter is a DR (Dielectric Resonator) filter.

2. The microwave signal generator as claimed in claim 1, wherein the magnetron, the coupler and the band-pass filter are connected by a coaxial cable or a waveguide.

3. The microwave signal generator as claimed in claim 1, wherein the coupler is a coupler using any one coupling method out of center loop coupling method, halo loop coupling method, segment fed coupling method, strap fed coupling method and waveguide coupling method.

4. The microwave signal generator as claimed in claim 1, wherein the coupler is disposed within the load.

5. The microwave signal generator as claimed in claim 1, wherein the signal from the oscillation frequency band is a main signal corresponding to an intrinsic oscillation frequency band of the magnetron.

6. The microwave signal generator as claimed in claim 1, wherein the load is an electrode-less bulb having a light emitting material.

7. The microwave signal generator as claimed in claim 6, wherein the microwave signal from the coupler is used to heat the light emitting material of the electrode-less bulb.

8. A microwave signal generator comprising:

a magnetron integrally coupled to a load, wherein the magnetron generates a microwave signal;

a coupler disposed within the load, wherein the coupler receives the microwave signal generated by the magnetron and sends the microwave signal to the load; and a band-pass filter for passing only the microwave signal of an intrinsic oscillation frequency band of the magnetron from the microwave signal received by the coupler and the microwave signal of the intrinsic oscillation frequency band is fed back to the magnetron, wherein the band-pass filter is a DR (Dielectric Resonator) filter.

9. The microwave signal generator as claimed in claim 8, wherein the magnetron, the coupler and the band-pass filter are connected by a coaxial cable or a waveguide.

10. The microwave signal generator as claimed in 8, wherein the coupler is a coupler using any one coupling method out of center loop coupling method, halo loop coupling method, segment fed coupling method, strap fed coupling method and waveguide coupling method.

11. The microwave signal generator as claimed in claim 8, wherein the load is an electrode-less bulb having a light emitting material.

12. The microwave signal generator as claimed in claim 11, wherein the microwave signal from the coupler is used to heat the light emitting material of the electrode-less bulb.

13. A microwave signal generator comprising:

a magnetron to generate a microwave signal;

a filter to receive the microwave signal from the magnetron and to filter the microwave signal to obtain a feedback signal from the microwave signal, wherein the filter feeds the feedback signal back to the magnetron which is used to fix an oscillation frequency of the magnetron, wherein the filter receives the microwave signal through the coupler, and the filter is a band-pass filter that includes a DR (Dielectric Resonator) filter.

14. The microwave signal generator as claimed in claim 13, wherein the feedback signal is a signal corresponding to an intrinsic oscillation frequency band of the magnetron.

15. The microwave signal generator as claimed in claim 13, wherein the magnetron, the coupler and the filter are connected by a coaxial cable or a waveguide.

16. The microwave signal generator as claimed in claim 13, wherein the coupler is a coupler using any one coupling method out of center loop coupling method, halo loop coupling method, segment fed coupling method, strap fed coupling method and waveguide coupling method.

* * * * *